United States Patent [19]
Nabeshima et al.

[11] Patent Number: 5,881,046
[45] Date of Patent: Mar. 9, 1999

[54] SIGNAL RECORDING APPARATUS FOR RECORDING A SYNCHRONOUS AND CANCEL CODE ON A RECORDING MEDIUM

[75] Inventors: Daiki Nabeshima; Naoki Ozaki, both of Yokohama, Japan

[73] Assignee: Kabushiki Kaisha Toshiba, Kanagawa-ken, Japan

[21] Appl. No.: 733,911

[22] Filed: Oct. 18, 1996

Related U.S. Application Data

[62] Division of Ser. No. 375,428, Jan. 18, 1995, Pat. No. 5,587,991.

[30] Foreign Application Priority Data

Mar. 16, 1994 [JP] Japan .................................. P6-046010

[51] Int. Cl.$^6$ ....................................................... G11B 7/24
[52] U.S. Cl. ........................................ 369/275.3; 369/48
[58] Field of Search ................................... 369/275.3, 47, 369/48, 54, 58, 32, 275.1, 59, 51, 49, 275.4; 360/48–49

[56] References Cited

U.S. PATENT DOCUMENTS

| | | | |
|---|---|---|---|
| 4,914,527 | 4/1990 | Asai et al. | 360/10.3 |
| 4,963,868 | 10/1990 | Takayama et al. | 341/72 |
| 5,200,943 | 4/1993 | Sano | 369/48 |
| 5,446,724 | 8/1995 | Tabe | 369/275.1 |
| 5,469,416 | 11/1995 | Yamagami | 369/48 |
| 5,537,619 | 7/1996 | Higirashi et al. | 375/240 |
| 5,615,056 | 3/1997 | Oguro | 386/104 |

FOREIGN PATENT DOCUMENTS

A-7-30431   3/1994   Japan .

OTHER PUBLICATIONS

Watkinson, "The Art of Digital Audio", 1989, The Compact Disk, Focal Press, London XP002014970, pp. 471–490.

Patent Abstracts of Japan, vol. 12, No. 162 (E–609, May 17, 1988, and JP–A–62 272726, Oki Electric Ind. Co., Ltd. Nov., 26, 1987, Abstract.

Primary Examiner—Ali Neyzari
Attorney, Agent, or Firm—Cushman, Darby & Cushman IP Group of Pillsbury, Madison & Sutro LLP

[57] ABSTRACT

A recording medium having a SYNC (synchronous code) for synchronizing with data and a DCC (DC cancel code) for suppressing a DC component of a wave form of a signal recorded on the recording medium, the SYNC and the CDD being adjacently recorded on the recording medium. Both the SYNC and DCC are patterns that are not present in a data portion. A signal recording apparatus, comprising a DSV calculating means for calculating a DSV of a signal wave form recorded on the recording medium, a cancel code generating means for generating a cancel code for suppressing a DC component of the signal wave form corresponding to the DSV calculated by the DSV calculating means, and a recording means for connecting a synchronous code and record data to the cancel code generated by the cancel code generating means and recording the cancel code, the synchronous code, and the record data on the recording medium so that the cancel code and the synchronous code are adjacently disposed, the synchronous code being adapted for synchronizing with data. A signal reproducing apparatus, comprising a reading means for reading the signal from the recording medium, and a synchronous code detecting means for detecting a predetermined pattern contained in a continuous pattern of the synchronous code and the cancel code as a significant synchronous code for synchronizing with data from the signal read by the reading means.

2 Claims, 9 Drawing Sheets

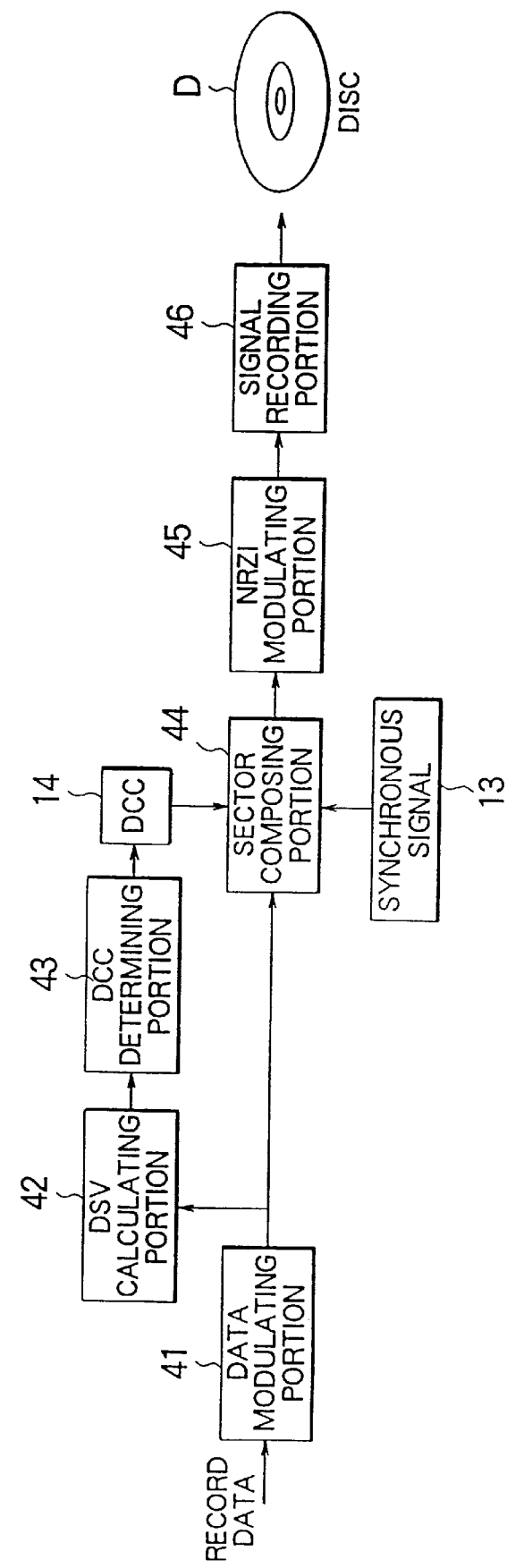

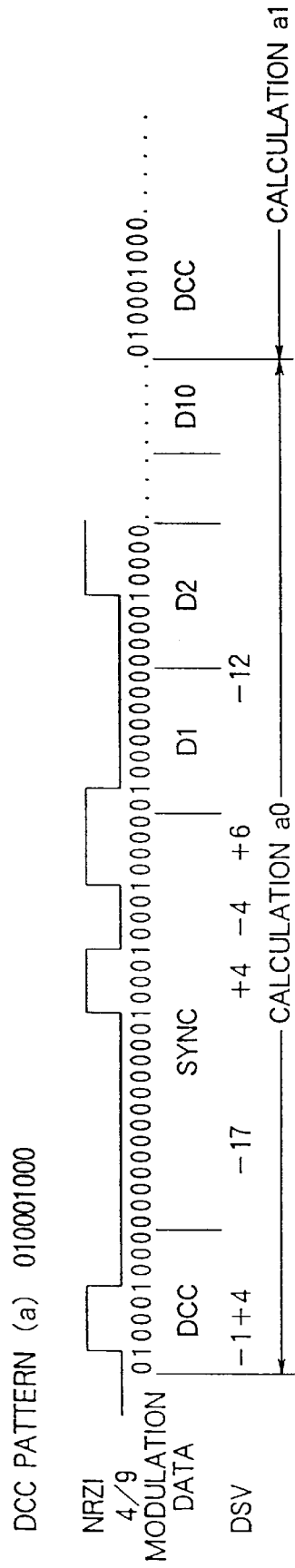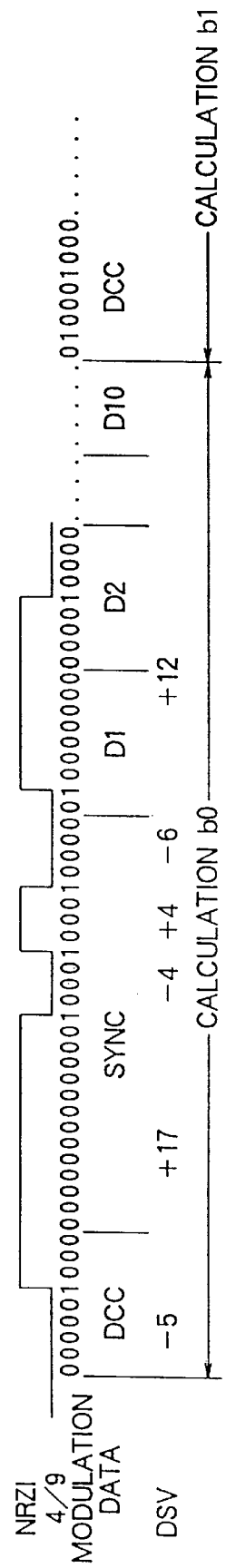

| Dn | Tn | CONDITION BY Dn+1 |
|---|---|---|
| 0 | 010000000 | |
| 1 | 001000000 | |
| 2 | 000100000 | |
| 3 | 000010000 | |
| 4 | 000001000 | |
| 5 | 000000100 | OTHER THAN (6,7,8,D,AND F),EM |
|   | 000010001 | (6,7,8,D,F) case (1) |
| 6 | 100010000 | |
| 7 | 100001000 | |
| 8 | 100000100 | OTHER THAN (6,7,8,D,AND F),EM |
|   | 100000001 | (6,7,8,D,F) case (1) |
| 9 | 010001000 | |
| A | 010000100 | OTHER THAN (6,7,8,D,AND F),EM |
|   | 010000001 | (6,7,8,D,F) case (1) |
| B | 001000100 | OTHER THAN (6,7,8,D,AND F),EM |
|   | 001000001 | (6,7,8,D,F) case (1) |
|   | 001000010 | OTHER THAN (0,6,7,8,9,A,D, AND F) AND DCC, EM |
| C | 001100001 | (6,7,8,D,F) case (1) DCC (INV) |
|   | 000000001 | (0,9,A) case (2) DCC (INV) |
|   | 100000010 | OTHER THAN (0,6,7,8,9,A,D, |

| DCC | 000001000 | INV |
|---|---|---|
|   | 010001000 | non INV |

Case (1)

| Dn+1 | Tn+1 | Dn+2 | Tn+2 |
|---|---|---|---|
| 6 | 000000000 | F | 100000000 |
|   |   | 0 | 010000000 |
|   |   | 1 | 001000000 |
|   |   | 2 | 000100000 |
|   |   | 3 | 000010000 |
|   |   | 4 | 000001000 |
|   |   | 6 | 100010000 |
|   |   | 7 | 100001000 |
|   |   | 9 | 010001000 |
|   |   | DCC, EM | |
|   | 000100010 | B | 001000000 |
|   |   | C | 000100000 |
|   |   | D | 000010000 |
|   |   | E | 000001000 |
|   | 000010001 | 5 | 000100000 |
|   |   | 8 | 000010000 |
|   |   | A | 000001000 |
| 7 | 000000100 | 0 | 010000000 |
|   |   | 1 | 001000000 |
|   |   | 2 | 000100000 |
|   |   | 3 | 000010000 |

Case (2)

| 0 | 000100000 |
|---|---|
| 9 | 000010000 |
| A | 000001000 |

FIG. 11 (PRIOR ART)

FORMAT OF DATA/ECC PORTION

| | | | | | | | | | | |
|---|---|---|---|---|---|---|---|---|---|---|
| SYNC | $D_1$ | $D_2$ | $D_3$ | $D_4$ | $D_5$ | DCC | $D_6$ | $D_7$ | $D_8$ | $D_9$ | $D_{10}$ |
| | $D_{11}$ | $D_{12}$ | $D_{13}$ | $D_{14}$ | $D_{15}$ | DCC | $D_{16}$ | $D_{17}$ | $D_{18}$ | $D_{19}$ | $D_{20}$ |
| | $D_{21}$ | $D_{22}$ | $D_{23}$ | $D_{24}$ | $D_{25}$ | DCC | $D_{26}$ | $D_{27}$ | $D_{28}$ | $D_{29}$ | $D_{30}$ |
| SYNC | $D_{31}$ | $D_{32}$ | $D_{33}$ | $D_{34}$ | $D_{35}$ | DCC | $D_{36}$ | $D_{37}$ | $D_{38}$ | $D_{39}$ | $D_{40}$ |
| | $D_{41}$ | $D_{42}$ | $D_{43}$ | $D_{44}$ | $D_{45}$ | DCC | $D_{46}$ | $D_{47}$ | $D_{48}$ | $D_{49}$ | $D_{50}$ |

Data 104 rows

| | | | | | | | | | | |
|---|---|---|---|---|---|---|---|---|---|---|
| SYNC | $D_{991}$ | $D_{992}$ | $D_{993}$ | $D_{994}$ | $D_{995}$ | DCC | $D_{996}$ | $D_{997}$ | $D_{998}$ | $D_{999}$ | $D_{1000}$ |
| | $D_{1001}$ | $D_{1002}$ | $D_{1003}$ | $D_{1004}$ | $D_{1005}$ | DCC | $D_{1006}$ | $D_{1007}$ | $D_{1008}$ | $D_{1009}$ | $D_{1010}$ |
| | $D_{1011}$ | $D_{1012}$ | $D_{1013}$ | $D_{1014}$ | $D_{1015}$ | DCC | $D_{1016}$ | $D_{1017}$ | $D_{1018}$ | $D_{1019}$ | $D_{1020}$ |
| SYNC | $D_{1021}$ | $D_{1022}$ | $D_{1023}$ | $D_{1024}$ | $F_1$ | DCC | $F_2$ | $F_3$ | $F_4$ | $F_5$ | $F_6$ |
| | $F_7$ | $F_8$ | $F_9$ | $F_{10}$ | $F_{11}$ | DCC | $F_{12}$ | $CRC_1$ | $CRC_2$ | $CRC_3$ | $CRC_4$ |
| | $E_{1,1}$ | $E_{2,1}$ | $E_{3,1}$ | $E_{4,1}$ | $E_{5,1}$ | DCC | $E_{6,1}$ | $E_{7,1}$ | $E_{8,1}$ | $E_{9,1}$ | $E_{10,1}$ |
| SYNC | $E_{1,2}$ | $E_{2,2}$ | $E_{3,2}$ | $E_{4,2}$ | $E_{5,2}$ | DCC | $E_{6,2}$ | $E_{7,2}$ | $E_{8,2}$ | $E_{9,2}$ | $E_{10,2}$ |
| | $E_{1,3}$ | $E_{2,3}$ | $E_{3,3}$ | $E_{4,3}$ | $E_{5,3}$ | DCC | $E_{6,3}$ | $E_{7,3}$ | $E_{8,3}$ | $E_{9,3}$ | $E_{10,3}$ |

ECC 16 rows

| | | | | | | | | | | |
|---|---|---|---|---|---|---|---|---|---|---|
| | $E_{1,13}$ | $E_{2,13}$ | $E_{3,13}$ | $E_{4,13}$ | $E_{5,13}$ | DCC | $E_{6,13}$ | $E_{7,13}$ | $E_{8,13}$ | $E_{9,13}$ | $E_{10,13}$ |
| SYNC | $E_{1,14}$ | $E_{2,14}$ | $E_{3,14}$ | $E_{4,14}$ | $E_{5,14}$ | DCC | $E_{6,14}$ | $E_{7,14}$ | $E_{8,14}$ | $E_{9,14}$ | $E_{10,14}$ |
| | $E_{1,15}$ | $E_{2,15}$ | $E_{3,15}$ | $E_{4,15}$ | $E_{5,15}$ | DCC | $E_{6,15}$ | $E_{7,15}$ | $E_{8,15}$ | $E_{9,15}$ | $E_{10,15}$ |
| | $E_{1,16}$ | $E_{2,16}$ | $E_{3,16}$ | $E_{4,16}$ | $E_{5,16}$ | DCC | $E_{6,16}$ | $E_{7,16}$ | $E_{8,16}$ | $E_{9,16}$ | $E_{10,16}$ |

FIG. 12 (PRIOR ART)

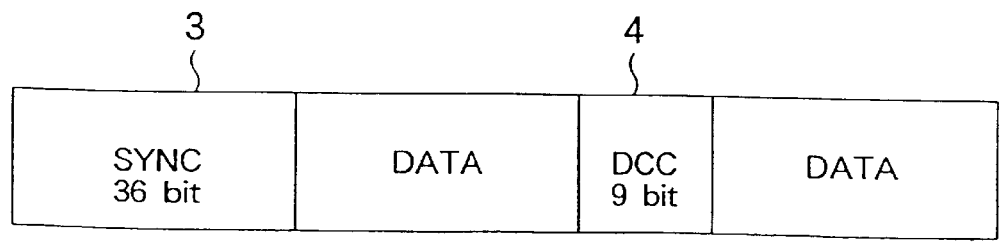

SIGNAL RECORDING APPARATUS FOR RECORDING A SYNCHRONOUS AND CANCEL CODE ON A RECORDING MEDIUM

This is a division of application Ser. No. 08/375,428, filed Jan. 18, 1995, now U.S. Pat. No. 5,587,991.

BACKGROUND OF THE INVENTION

1. Field of the Invention

The present invention relates to a recording medium such as an optical disc, a signal recording apparatus thereof, and a signal reproducing apparatus thereof.

2. Description of the Related Art

When digital data is highly densely recorded on a recording medium such as an optical disc, the digital data should be modulated with a large value of the minimum code inversion length Tmin so as to record as much data in a limited bit length as possible.

To do that, in recent years, as a modulation system with a large value of the minimum code inversion length Tmin, 4–9 modulation system has been proposed. The 4–9 modulation system is described in for example Japanese Patent Application No. 5-76692. The 4–9 modulation system converts 4-bit data into 9-bit data. In the 4–9 modulation system, the minimum code inversion length Tmin is 4T (where T is a bit length) and the maximum code inversion length Tmax is 18T.

FIG. 9 is a schematic diagram showing the construction of a code conversion table for the 4–9 modulation system. In FIG. 9, Dn is a value of which an input binary data sequence is divided by every four bits and represented in hexadecimal (HEX) notation. $T_n$ is a binary bit pattern in which the input $D_n$ is converted into 9 bits and at least three "Os" are present between two bit "1s". Due to the relation between $D_n$ and $D_{n+1}$, two or three $T_n$ patterns are provided. Depending on the value of $D_{n+1}$, the pattern of $T_n$ is determined. When $D_n$=5, $T_n$ is either "000000100" or "000010001". When $D_{n+1}$ is 6, 7, 8, D, or F, $T_n$ is "000010001". Otherwise, $T_n$ is "000000100". When $T_n$ is "000000100", depending on $D_{n+1}$, $D_{n+2}$ also corresponds to the table of case (1). As a practical example, when D is 5, 6, or 7, "000010001", "000000000", or "100001000" can be obtained, respectively.

When data is recorded on the recording medium, the resultant 4–9 modulation code is modulated corresponding to NRZI (Non-Return to Zero Inverted) technique.

On the other hand, when data is reproduced from the recording medium, a synchronous code should be regularly recorded on the recording medium so as to read data, byte by byte. The synchronous code is hereinafter referred to as SYNC. The SYNC is a predetermined pattern that is not present in data portion.

In the 4–9 modulation system or the like, the signal that has been modulated corresponding to the NRZI technique contains a DC component. To suppress the DC component, a DC cancel code (DCC) is added to the data portion.

FIG. 10 shows the construction of a sector of a conventional optical disc. FIG. 11 shows the construction of a data portion of FIG. 10. As shown in these drawings, each sector is composed of an address portion 1 and a DATA/ECC portion 2. The SYNCs 3 and the DCCs 4 are regularly placed in at least the DATA/ECC portion 2. The DATA/ECC portion 2 is composed of a plurality of blocks, each of which has a predetermined bit length.

FIG. 12 shows the relation of positions of the SYNC 3 and the DCC 4 of FIG. 11. As shown in FIG. 12, data is placed between the SYNC 3 and the DCC 4. The signal length of the SYNC 3 is 36 bits. The signal length of the DCC 4 is 9 bits.

Although the DCC 4 is an essential code for suppressing the DC component of the wave form of a signal recorded on the disc, the data recording area of the DATA/ECC portion 2 is correspondingly decreased, thereby obstructing the high dense recording of the recording medium.

In the sector format of the conventional optical disc or the like, since the synchronous code and the cancel code are dispersedly disposed, the redundant portion other than the data portion becomes large, thereby restricting the amount of data recorded on the recording medium.

SUMMARY OF THE INVENTION

The present invention is made to solve the above-described problem. An object of the present invention is to provide a recording medium, a signal recording apparatus thereof, and a signal reproducing apparatus thereof that allow the redundant portion composed of the synchronous code and the cancel code to be reduced and thereby the amount of recordable data and the recording density to be increased.

Another object of the present invention is to provide a recording medium, a signal recording apparatus thereof, a signal reproducing apparatus thereof that allow the redundant portion composed of the synchronous code and the cancel code to be reduced without deteriorating the function of the cancel code.

A further object of the present invention is to provide a recording medium, a signal recording apparatus thereof, a signal reproducing apparatus thereof that allow the reproduced data to be securely synchronized and thereby the reliability of the reproduced signal to be improved.

A first aspect of the present invention is a recording medium having a synchronous code and a cancel code, the synchronous code being adapted for synchronizing data, the cancel code being adapted for suppressing a DC component of a signal wave form recorded on the recording medium, the synchronous code and the cancel code being adjacently recorded on the recording medium.

A second aspect of the present invention is a recording medium having a cancel code and a synchronous code, the cancel code being adapted for suppressing a DC component of a signal wave form recorded on the recording medium, the synchronous code being adapted for synchronizing data, the cancel code containing part of the synchronous code being recorded on the recording medium.

A third aspect of the present invention is a signal recording apparatus of a recording medium, comprising a DSV calculating means for calculating a DSV (Digital Sum Value) of a signal wave form recorded on the recording medium, a cancel code generating means for generating a cancel code for suppressing a DC component of the signal wave form corresponding to the DSV calculated by the DSV calculating means, and a recording means for connecting a synchronous code and record data to the cancel code generated by the cancel code generating means and recording the cancel code, the synchronous code, and the record data on the recording medium so that the cancel code and the synchronous code are adjacently disposed, the synchronous code being adapted for synchronizing with data.

A fourth aspect of the present invention is a signal recording apparatus of a recording medium, comprising a DSV calculating means for calculating a DSV of a signal wave form recorded on the recording medium, a cancel code generating means for generating a cancel code for suppressing a DC component of the signal wave form corresponding to the DSV calculated by the DSV calculating means, and a recording means for connecting a predetermined signal pattern and record data to the cancel code generated by the cancel code generating means and recording the cancel code, the predetermined signal pattern, and the record data on the recording medium so that the cancel code and the predetermined signal pattern are adjacently disposed, the predetermined signal pattern being part of a synchronous code, the synchronous code being adapted for synchronizing with data.

A fifth aspect of the present invention is a signal reproducing apparatus for reproducing data from a recording medium on which a synchronous code for synchronizing with data and a cancel code for suppressing a DC component of a wave form of a signal are recorded, the synchronous code and the cancel code being adjacently recorded on the recording medium, comprising a reading means for reading the signal from the recording medium, and a synchronous code detecting means for detecting a predetermined pattern contained in a continuous pattern of the synchronous code and the cancel code as a significant synchronous code for synchronizing with data from the signal read by the reading means.

A sixth aspect of the present invention is a signal reproducing apparatus for reproducing data from a recording medium on which a cancel code for suppressing a DC component of a wave form of a signal is recorded, the cancel code containing part of a synchronous code for synchronizing with data, comprising a reading means for reading the signal from the recording medium, and a synchronous code detecting means for detecting a predetermined pattern contained in a continuous pattern of the synchronous code and the cancel code as a significant synchronous code for synchronizing with data from the signal read by the reading means.

Thus, according to the present invention, the synchronous code and the cancel code have been adjacently recorded on the recording medium. When data is reproduced, a predetermined pattern contained in a continuous pattern of the synchronous code and the cancel code is detected as a significant synchronous code that synchronizes with data. Consequently, without need to reduce the bit length of the synchronous code to be detected and without deteriorating the function of the cancel code, the amount of data that is recorded on the recording medium can be increased, thereby increasing the recording density.

Moreover, according to the present invention, the cancel code is recorded on the recording medium in such a manner that part of the synchronous code is contained in the cancel code. When data is reproduced, a predetermined pattern contained in a continuous pattern of the synchronous code and the cancel code is detected as a significant synchronous code that synchronizes with the data. Thus, without reducing the bit length of the synchronous code to be detected and deteriorating the function of the cancel code, the amount of data that is recorded on the recording medium can be increased, thereby increasing the recording density.

Furthermore, according to the present invention, since part or all of the cancel code is included in the synchronous code, when data is reproduced, it can be securely synchronized, thereby improving the reliability of the reproduced signal.

These and other objects, features and advantages of the present invention will become more apparent in light of the following detailed description of best mode embodiments thereof, as illustrated in the accompanying drawings.

BRIEF DESCRIPTION OF THE DRAWINGS

FIG. 4 is a block diagram showing the construction of a signal recording apparatus according to the present invention;

FIGS. 5A and 5B are schematic diagram for explaining a calculating method of DSV and a determining method of DCC for two types of DCC values (a and b);

FIG. 11 is a schematic diagram showing the construction of a data portion of FIG. 10; and FIG. 12 is a schematic diagram showing the relation of the positions of a SYNC and a DCC of FIG. 11 and signal lengths thereof.

DESCRIPTION OF THE PREFERRED EMBODIMENTS

Next, with reference to the accompanying drawings, embodiments of the present invention will be described.

Figure 1:
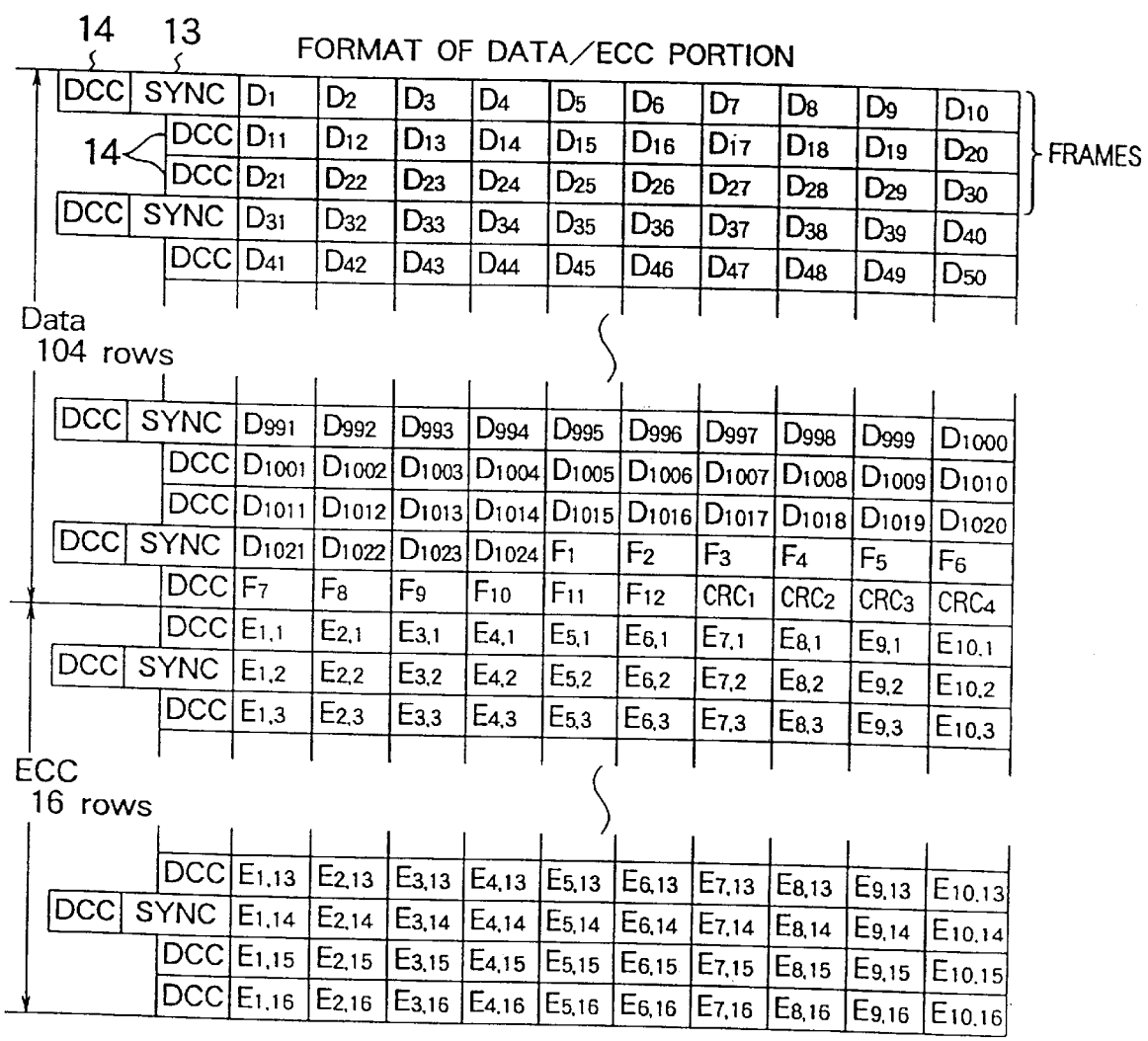
FIG. 1 is a schematic diagram showing the construction of a DATA/ECC portion in a sector format of an optical disc according to an embodiment of the present invention.
Figure 2:
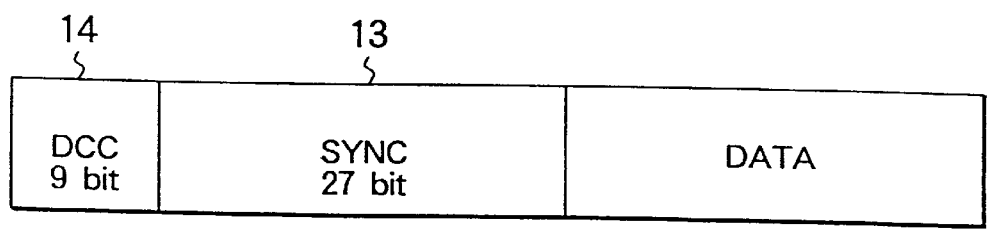
FIG. 2 is a schematic diagram showing the relation of the positions of a SYNC and a DCC in the DATA/ECC portion of FIG. 1.

FIG. 1 is a schematic diagram showing the construction of a DATA/ECC portion in a sector format of an optical disc according to an embodiment of the present invention. FIG. 2 is a schematic diagram showing the relation of the positions of a SYNC (synchronous code) and a DCC (DC cancel code) in the DATA/ECC portion of FIG. 1 and signal lengths thereof.

As shown in FIGS. 1 and 2, at the beginning of each frame of the DATA/ECC portion, the SYNC 13 and the DCC 14 are adjacently disposed. In other words, at the beginning of the frame, the DCC 14 is disposed. The DCC 14 is followed by the SYNC 13. The signal length of the SYNC 13 is 27 bits. The signal length of the DCC 14 is 9 bits. Thus, the total signal length of the SYNC 13 and the DCC 14 is 36 bits.

Figure 3:
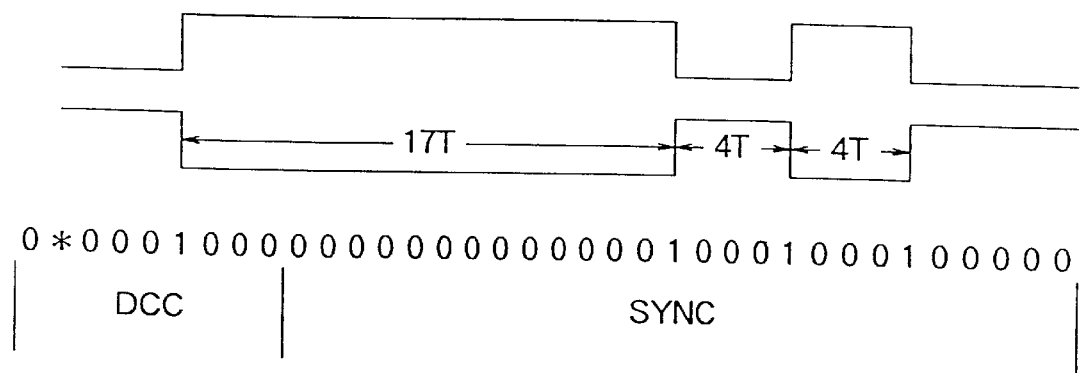
FIG. 3 is a schematic diagram showing patterns of the SYNC and the DCC.

FIG. 3 is a schematic diagram showing patterns of the SYNC 13 and the DCC 14. Referring to FIG. 3, in the "*" portion, the value of "0" or "1" is placed. The SYNC 13 and the DCC 14 are represented with predetermined patterns that are not present in the data portion, namely the 4–9 modulation code. Thus, a continuous pattern composed of the SYNC 13 and the DCC 14 can be treated as a single SYNC pattern. In this example, as a pattern that is not present in the data portion, a pattern with the code inversion lengths for 17T, 4T, 4T and 6T is used.

Thus, in the optical disc according to this embodiment, since the continuous pattern composed of (SYNC 13+DCC 14) can be treated as a single SYNC pattern, the signal length of the SYNC 13 can be reduced for the signal length of the DCC 14, thereby improving the recording density without deteriorating the function of the DCC 14.

Next, a signal recording apparatus that records the continuous pattern composed of the SYNC 13 and the DCC 14 will be described.

FIG. 4 is a block diagram showing the construction of a signal recording apparatus according to the present invention. Referring to FIG. 4, the signal recording apparatus comprises a data modulating portion 41, a DSV calculating portion 42, a DCC determining portion 43, a sector composing portion 44, an NRZI modulating portion 45, and a signal recording portion 46.

The data modulating portion 41 performs the 4–9 modulation for the input data and supplies a 4–9 modulation signal to the DSV calculating portion 42 and the sector composing portion 44. The DSV calculating portion 42 calculates a DSV (Digital Sum Value) corresponding to the input 4–9 modulation signal and supplies the DSV to the DCC determining portion 43. The DSV is obtained, block by block (for example, as blocks of D1 to D10, D11 to D20, and D21 to D30 of FIG. 1). Whenever the DSV is obtained, the DCC is determined. For example, as shown in FIGS. 5A and 5B, now assume that two DCC values ("010001000" and "000001000") are used so as to calculate DSVs for these values. Thereafter, the absolute values of the DSVs are compared and the DCC with the smaller absolute value is determined as the DCC 14 to be recorded. The sector composing portion 44 adds the determined DCC 14 to the record data along with the SYNC 13. Thereby the sector format shown in FIG. 1 is composed. Thereafter, the NRZI modulating portion 45 performs the NRZI modulation for the 4–9 modulation signal composed of the DCC 14, the SYNC 13, and the record data. The signal recording portion 46 records the 4–9 modulation signal on a recording medium (optical disc) D.

Next, a signal reproducing apparatus that reproduces a signal from the recording medium will be described.

Figure 6:
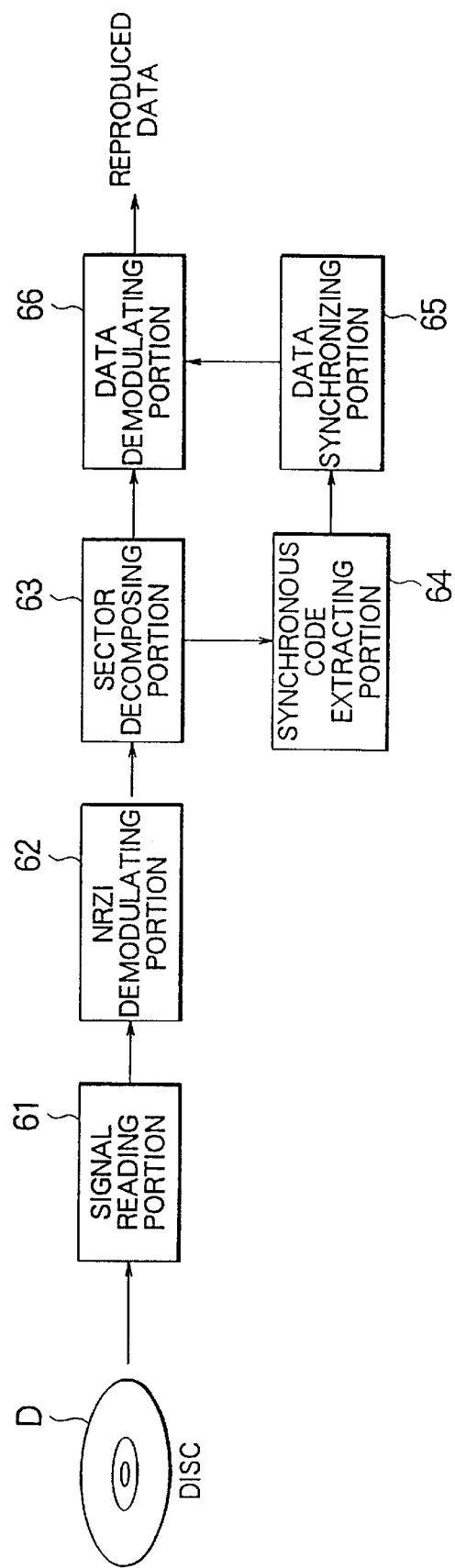
FIG. 6 is a block diagram showing the construction of a signal reproducing apparatus according to the present invention.

FIG. 6 is a block diagram showing the construction of the signal reproducing apparatus. Referring to FIG. 6, the signal reproducing apparatus comprises a signal reading portion 61, an NRZI demodulating portion 62, a sector decomposing portion 63, a synchronous code extracting portion 64, a data synchronizing portion 65, and a data demodulating portion 66. The signal reading portion 61 reads a signal that has been recorded on a recording medium D and supplies the signal to the NRZI demodulating portion 62. The NRZI demodulating portion 62 performs NRZI demodulation for the read signal and supplies the demodulation signal that is a 4–9 modulation signal to the sector decomposing portion 63. The sector decomposing portion 63 extracts a data portion from the 4–9 modulation signal that composes the sector format and supplies the data portion to the data demodulating portion 66. The synchronous code extracting portion 64 extracts DCC 14+SYNC 13 from the 4–9 modulation signal and supplies them to the data synchronizing portion 65. The data synchronizing portion 65 includes a SYNC detecting circuit. The SYNC detecting circuit detects a significant SYNC pattern necessary for synchronizing with data from DCC 14+SYNC 13. The SYNC detecting circuit will be described later in more detail. The data synchronizing portion 65 generates a data extracting timing for the data demodulating portion 66 corresponding to the detected result of the SYNC pattern so that the data demodulating portion 66 performs the 4–9 demodulation for the data, byte by byte. Thus, reproduced data is output.

Figure 7:
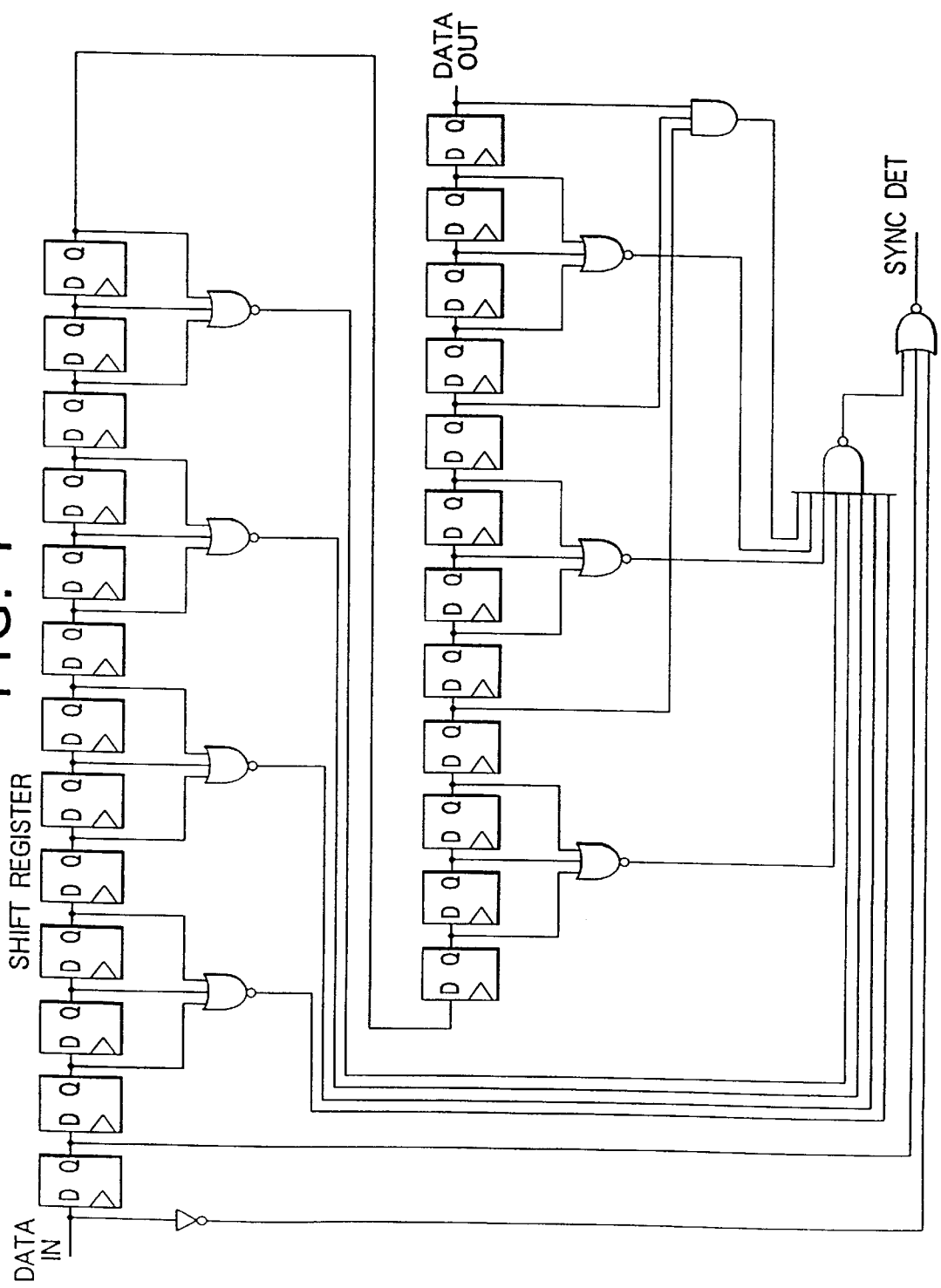
FIG. 7 is a block diagram showing the construction of a SYNC detecting circuit.

FIG. 7 is a schematic diagram showing a construction of the SYNC detecting circuit. The SYNC detecting circuit comprises a shift register and some logic gates. In other words, the SYNC detecting circuit inputs serial data that has been NRZI demodulated whenever a bit clock takes place. When the input pattern accords with the above-described SYNC pattern, the SYNC detecting circuit outputs a SYNC detection signal.

Tables 1 and 2 show pairs (a) to (j') of the significant SYNC pattern and detected bit sequences. The upper row of each pair represents the significant SYNC pattern composed of 36 bits of DCC+SYNC. The lower row of each pair represents part of the significant SYNC pattern. For example, the lower row of the pair (a) represents that 26 bits other than the high order five bits and the low order five bits of the significant SYNC pattern composed of 36 bits of DCC+SYNC are detected bits of the significant SYNC pattern. The 26-bit pattern is the minimum required number of bits for pattern comparison since the first bit is an inversion point of the value of the DCC and the last bit is the start bit of a sequence of 6T of the pattern of sequences of 17T, 4T, 4T, and 6T (that are not present in the data portion). The lower row of the pair (j') represents that all bits of DCC+SYNC are detected bits of the significant SYNC pattern. In other words, a bit sequence as the significant SYNC pattern can be selected from the minimum bit number of the lower row of the pair (a) in Table 1 to all the bits of DCC+SYNC of the lower row of the pair (j') of Table 2. In this embodiment, the DCC 14 is disposed at the first block of frames that contain the SYNC 13. In addition, the DCC 14 is disposed at the beginning of each block. Conventionally, the DCC is added so as to suppress the DC component when a signal is recorded. Thus, when data is reproduced, the DCC is not necessary. According to the present invention, since the DCC 14 is disposed at the beginning of each block along with the first block, the DCC 14 can be used as auxiliary information that allows data to be synchronized between each SYNC 13.

Thus, even if the SYNC 13 cannot be detected due to a burst error and thereby data cannot be synchronized, with the DCC 14 of each block, the data can be synchronized. Consequently, the synchronism restoring time can be more shortened than the case that data is synchronized with only the SYNC pattern. When the synchronism restoring time is shortened, the amount of data that is processed can be increased and the reliability of the data can be improved.

When only the SYNC pattern is used, an incorrectable error may take place. However, when data is synchronized using the DCC 14 of each block, the probability of which the error is corrected is increased. The situation that the error cannot be corrected is remarkably reduced, thereby reducing the load applied to the error correcting side.

Figure 8:
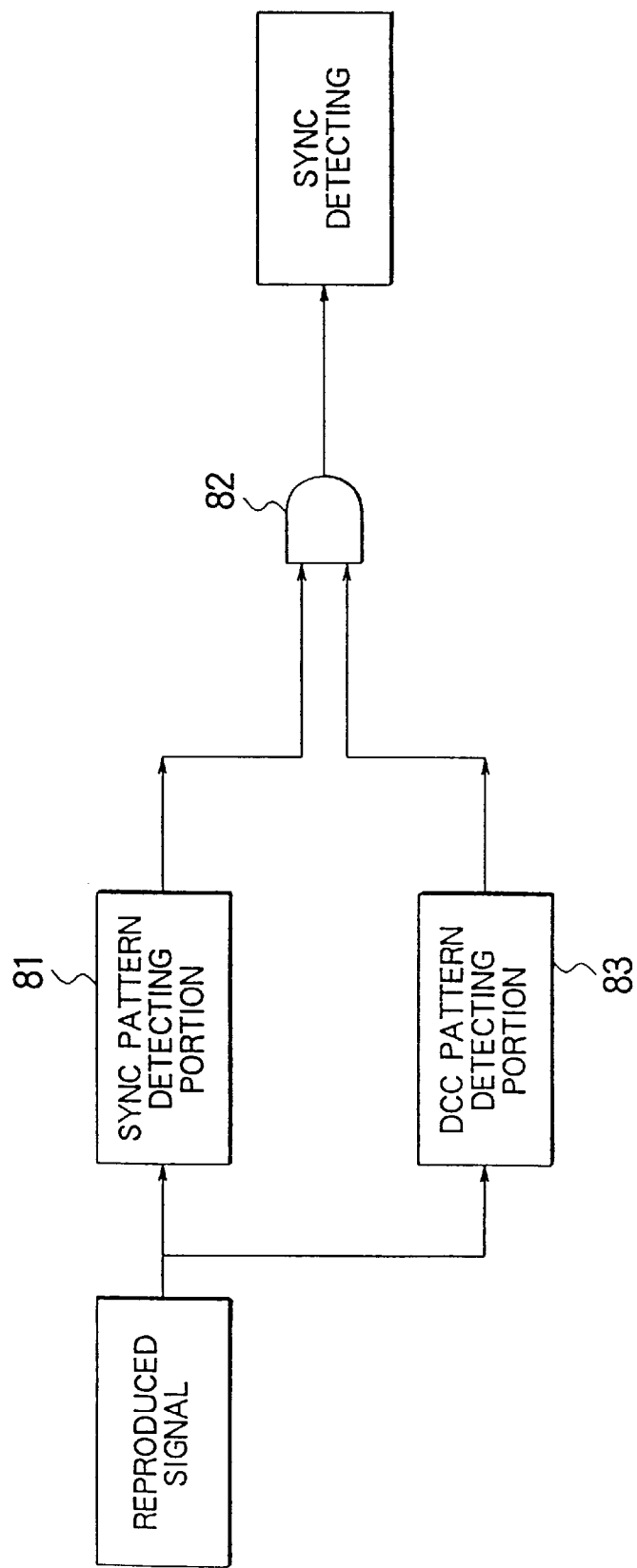
FIG. 8 is a block diagram showing the construction of a synchronous pattern detecting portion according to another embodiment of the present invention.
Figures 9, 10:
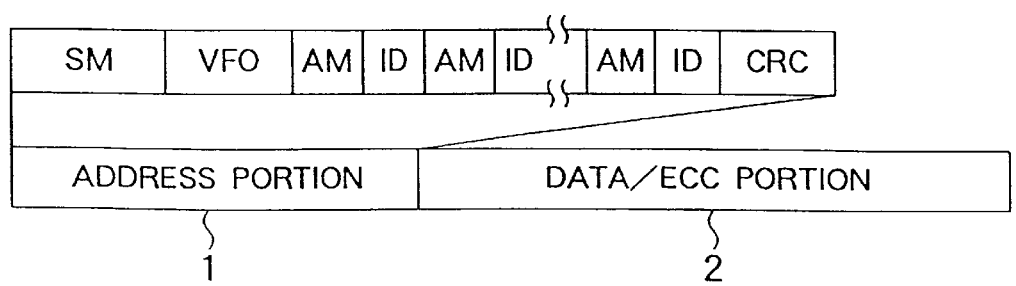
FIG. 9 is a schematic diagram showing the construction of a code conversion table for 4–9 modulation system.
FIG. 10 is a schematic diagram showing the construction of a sector of a conventional optical disc.

In the embodiment, a significant SYNC pattern contained in the continuous pattern of SYNC 13+DCC 14 is detected so as to synchronize with data. However, as shown in FIG. 8, not only the SYNC pattern, but a pattern of the DCC 14 may be detected so as to synchronize with data. In FIG. 8, reference numeral 81 is a SYNC pattern detecting portion. As with the above-described SYNC detecting circuit, the SYNC pattern detecting portion 81 detects a significant SYNC pattern contained in the continuous pattern of SYNC 13+DCC 14 and supplies the detected signal to an AND gate 82. Reference numeral 83 is a DCC pattern detecting portion that detects only a pattern of the DCC 14 and outputs the detected signal to the AND gate 82. Thus, in this construction, only when both the patterns of the SYNC 13 and the DCC 14 are detected, the SYNC is detected. Consequently, the accuracy of detecting the SYNC is raised and thereby the reliability of synchronism of data can be improved.

In the first embodiment, the SYNC pattern contains a sequence of a code inversion length for 17T. However, the SYNC pattern may contain a sequence of a code inversion length for 18T.

In the first embodiment, the 4–9 modulation system is used. However, as long as the sector format contains the SYNC 13 and the DCC 14, a variety of modulation systems such as another RLL (Run Length Limited) modulation system may be applied to the present invention.

In the first embodiment, the DCC 14 is disposed at the beginning of each frame and followed by the SYNC 13. However, the SYNC 13 may be disposed at the beginning of each frame and followed by the DCC 14.

As described above, in the recording medium, the signal recording apparatus thereof, and the signal reproducing apparatus thereof according to the present invention, the amount of data that is recorded on the recording medium can be increased without shortening the bit length of the synchronous pattern to be detected and without deteriorating the function of the cancel code. In addition, since part or all of the cancel code is contained in the synchronous pattern to be detected, when data is reproduced, it can be securely synchronized, thereby improving the reliability of the reproduced signal.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

TABLE 1

(a) 0*000100000000000000001000100000
    1000000000000000100010001
(b) 0*000100000000000000001000100000
    0100000000000000100010001
(c) 0*000100000000000000001000100000
    0010000000000000100010001
(d) 0*000100000000000000001000100000
    0001000000000000100010001
(e) 0*000100000000000000001000100000
    *0001000000000000100010001
(f) 0*000100000000000000001000100000
    0*0001000000000000100010001
(g) 0*000100000000000000001000100000
    1000000000000000100010010
(h) 0*000100000000000000001000100000
    0100000000000000100010010
(i) 0*000100000000000000001000100000
    0010000000000000100010010
(j) 0*000100000000000000001000100000
    0001000000000000100010010
(k) 0*000100000000000000001000100000
    *0001000000000000100010010
(l) 0*000100000000000000001000100000000

TABLE 1-continued

0*000100000000000000001000100010
(m) 0*000100000000000000001000100000
    1000000000000000100010000100
(n) 0*000100000000000000001000100000
    0100000000000000100010000100
(o) 0*000100000000000000001000100000
    0010000000000000100010000100
(p) 0*000100000000000000001000100000
    0001000000000000100010000100
(q) 0*000100000000000000001000100000
    *000100000000000000100010000100
(r) 0*000100000000000000001000100000
    0*000100000000000000100010000100

TABLE 2

(s) 0*000100000000000000001000100000
    1000000000000000100010001000
(t) 0*000100000000000000001000100000
    0100000000000000100010001000
(u) 0*000100000000000000001000100000
    0010000000000000100010001000
(v) 0*000100000000000000001000100000
    0001000000000000100010001000
(w) 0*000100000000000000001000100000
    *0001000000000000100010001000
(x) 0*000100000000000000001000100000
    0*000100000000000000100010001000
(y) 0*000100000000000000001000100000
    1000000000000000100010010000
(z) 0*000100000000000000001000100000
    0100000000000000100010010000
(a') 0*000100000000000000001000100000
    0010000000000000100010010000
(b') 0*000100000000000000001000100000
    0001000000000000100010010000
(c') 0*000100000000000000001000100000
    *0001000000000000100010010000
(d') 0*000100000000000000001000100000
    0*000100000000000000100010010000
(e') 0*000100000000000000001000100000
    1000000000000000100010100000
(f') 0*000100000000000000001000100000
    0100000000000000100010100000
(g') 0*000100000000000000001000100000
    0010000000000000100010100000
(h') 0*000100000000000000001000100000
    0001000000000000100010100000
(i') 0*000100000000000000001000100000
    *0001000000000000100010100000
(j') 0*000100000000000000001000100000
    0*000100000000000000100010100000

What is claimed is:

1. A signal recording apparatus for recording information on a recording medium comprising a first region having a plurality of blocks adapted to record data therein, each of said blocks having a predetermined bit length; and a second region including a synchronous code for synchronizing data and a cancel code for suppressing a DC component of a signal recorded on said recording medium, said synchronous code and said cancel code being adjacently recorded in said second region, a total bit length of said synchronous code and said cancel code being an integral multiple of said bit length of said block, said apparatus comprising:

DSV (Digital Sum Value) calculating means for calculating a DSV of a signal to be recorded on said recording medium;

cancel code generating means for generating a cancel code for suppressing said DC component of said recorded signal corresponding to said DSV calculated by said DSV calculating means; and recording means for recording said plurality of blocks in said first region of said recording medium and for recording in said second region of said recording medium said cancel code and synchronous code corresponding to said cancel code generated by said cancel code generating means.

2. The signal recording apparatus as set forth in claim 1, wherein said total bit length of said synchronous code and said cancel code is two times of said bit length of said block.

* * * * *

UNITED STATES PATENT AND TRADEMARK OFFICE
CERTIFICATE OF CORRECTION

PATENT NO.     : 5,881,046

DATED          : Mar. 9, 1999

INVENTOR(S)    : NABESHIMA et al.

It is certified that error appears in the above-identified patent and that said Letters Patent is hereby corrected as shown below:

Column 4, line 19, change "diagram" to --diagrams--.

Column 7, line 63, TABLE 1, change "(j) 0*0001000000000000000010001000100000
                                          000100000000000000001000100010"
to
--(j) 0*00010000000000000000010001000100000
      0001000000000000000001000100010--;

line 67, change "(l) 0*000100000000000000001000100000000"
to
--(l) 0*0001000000000000000010001000100000--.

Signed and Sealed this

Fourteenth Day of March, 2000

Attest:

Q. TODD DICKINSON

Attesting Officer

Commissioner of Patents and Trademarks